(12) United States Patent
Liu

(10) Patent No.: US 10,727,296 B2
(45) Date of Patent: Jul. 28, 2020

(54) METHODS OF MANUFACTURING DRIVING SUBSTRATES, DRIVING SUBSTRATES AND DISPLAY APPARATUSES

(71) Applicant: Kunshan Go-Visionox Opto-Electronics Co., Ltd., Kunshan (CN)

(72) Inventor: Huan Liu, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/414,757

(22) Filed: May 16, 2019

(65) Prior Publication Data

US 2019/0273128 A1  Sep. 5, 2019

Related U.S. Application Data

(63) Continuation of application No. PCT/CN2018/113111, filed on Oct. 31, 2018.

(30) Foreign Application Priority Data

May 14, 2018 (CN) .......................... 2018 1 0457586

(51) Int. Cl.
*H01L 49/02* (2006.01)
*H01L 27/12* (2006.01)
(Continued)

(52) U.S. Cl.
CPC ............ *H01L 28/60* (2013.01); *C23C 16/345* (2013.01); *C23C 16/401* (2013.01); *C23C 16/52* (2013.01);
(Continued)

(58) Field of Classification Search
CPC ......... G09G 3/3233; G09G 2320/0233; G09G 2300/0819; G09G 2300/0861;
(Continued)

(56) References Cited

U.S. PATENT DOCUMENTS 5,368,915 A    11/1994  Ueda
2008/0203506 A1  8/2008  David et al.
(Continued)

FOREIGN PATENT DOCUMENTS

CN    101853859 A    10/2010
CN    101989631 A    3/2011
(Continued)

OTHER PUBLICATIONS

CN First Office Action dated Aug. 27, 2019 in the corresponding CN application (application No. 201810457586.2).

*Primary Examiner* — Mohammed R Alam
(74) *Attorney, Agent, or Firm* — Kilpatrick Townsend & Stockton, LLP

(57) ABSTRACT

Exemplary embodiments of the present disclosure provide methods of manufacturing driving substrates, including: obtaining a first thickness value of the first dielectric layer based on a difference between loads of all first storage capacitors of a specially-shaped display driving area and loads of all second storage capacitors of a normal display driving area; providing a substrate and depositing a first metal layer on a surface of the substrate; controlling a film forming process parameter by using a film thickness control model, and depositing the first dielectric layer and the second dielectric layer on a surface of the first metal layer, so that a thickness of the first dielectric layer reaches a first thickness value and a thickness of the second dielectric layer
(Continued)

reaches a second thickness value larger than the first thickness value. A driving substrate and a display apparatus are also disclosed.

19 Claims, 3 Drawing Sheets

(51) Int. Cl.
  *H01L 21/66* (2006.01)
  *H01L 21/02* (2006.01)
  *C23C 16/40* (2006.01)
  *H01L 21/285* (2006.01)
  *C23C 16/52* (2006.01)
  *C23C 16/34* (2006.01)

(52) U.S. Cl.
  CPC .... *H01L 21/0217* (2013.01); *H01L 21/02164* (2013.01); *H01L 21/02208* (2013.01); *H01L 21/02219* (2013.01); *H01L 21/02271* (2013.01); *H01L 21/28568* (2013.01); *H01L 22/20* (2013.01); *H01L 27/124* (2013.01); *H01L 27/1255* (2013.01); *H01L 27/1259* (2013.01); *H01L 22/12* (2013.01)

(58) Field of Classification Search
  CPC ........ G09G 2300/0842; H01L 27/3265; H01L 51/5203; H01L 27/3244; H01L 2251/558; H01L 51/0011; H01L 51/56
  See application file for complete search history.

(56) References Cited

U.S. PATENT DOCUMENTS

| | | | |
|---|---|---|---|
| 2015/0001637 A1 | 1/2015 | Cheng et al. | |
| 2017/0141172 A1* | 5/2017 | Cho | H01L 27/3246 |
| 2017/0213883 A1* | 7/2017 | Zhang | H01L 27/3262 |

FOREIGN PATENT DOCUMENTS

| | | |
|---|---|---|
| CN | 104733492 A | 6/2015 |
| CN | 105116658 A | 12/2015 |
| CN | 106206618 A | 12/2016 |
| CN | 107123394 A | 9/2017 |
| CN | 107507838 A | 12/2017 |
| CN | 107749247 A | 3/2018 |
| CN | 108682669 A | 10/2018 |
| WO | 2019037185 A1 | 2/2019 |

* cited by examiner

METHODS OF MANUFACTURING DRIVING SUBSTRATES, DRIVING SUBSTRATES AND DISPLAY APPARATUSES

CROSS-REFERENCES TO RELATED APPLICATIONS

The present application is a continuation application of International Application No. PCT/CN2018/113111, filed Oct. 31, 2018, which claims the priority to Chinese Application No. 201810457586.2 filed May 14, 2018. The entireties of these applications are incorporated by reference herein for all purposes.

FIELD

Exemplary embodiments of the present disclosure relate to display, and in particular, to methods of manufacturing driving substrates, driving substrates and display apparatuses.

BACKGROUND

As the mobile phone industry continuously develops, more and more attention is paid to bezel-less mobile phones, which have screens with advantages of a large screen-to-body ratio and a narrow border to greatly improve visual effects.

SUMMARY

In view of the above, it is necessary to provide methods of manufacturing driving substrates, driving substrates and display apparatuses, in view of the problem of non-uniformity in display of a conventional screen with a slotting design.

According to one aspect of the present disclosure, a method of manufacturing a driving substrate is provided. The driving substrate includes a first storage capacitor and a second storage capacitor, the first storage capacitor is disposed in a specially-shaped display driving area and includes a first dielectric layer, the second storage capacitor is disposed in a normal display driving area and includes a second dielectric layer, and the first dielectric layer and the second dielectric layer are formed on a same plane.

The method includes:

obtaining a first thickness value of the first dielectric layer based on a difference between a capacitive load of a first signal line of the specially-shaped display driving area and a capacitive load of a second signal line of the normal display driving area;

providing a substrate and depositing a first metal layer on a surface of the substrate; and controlling a film forming process parameter by using a film thickness control model, and depositing the first dielectric layer and the second dielectric layer on a surface of the first metal layer, so that a thickness of the first dielectric layer reaches the first thickness value and a thickness of the second dielectric layer reaches a second thickness value greater than the first thickness value.

In an embodiment, the film thickness control model includes a relation between a dielectric gas flow rate and a film thickness growth rate, and the depositing the first dielectric layer and the second dielectric layer on the surface of the first metal layer includes:

depositing the first dielectric layer and the second dielectric layer on the surface of the first metal layer simultaneously;

directing dielectric gas to pass through a deposition position of the second dielectric layer and a deposition position of the first dielectric layer, the dielectric gas having a gas flow rate of a first gas flow rate value to pass through the deposition position of the first dielectric layer, and a gas flow rate of a second gas flow rate value to pass through the deposition position of the second dielectric layer;

obtaining, based on the first thickness value and the first gas flow rate value, a first growth time of the first dielectric layer by using the relation between the dielectric gas flow rate and the film thickness growth rate, so that the first dielectric layer grows to have a thickness reaching the first thickness value; and obtaining, based on the second thickness value and the second gas flow rate value, a second growth time of the second dielectric layer by using the relation between the dielectric gas flow rate and the film thickness growth rate, so that the second dielectric layer grows to have a thickness reaching the second thickness value.

In the above method of manufacturing the driving substrate, the second growth time is greater than the first growth time, and when the first growth time is reached, a barrier is disposed between the first dielectric layer and the second dielectric layer to prevent the first dielectric layer from growing.

In the above method of manufacturing the driving substrate, the dielectric gas includes trimethylsilylamine gas and ammonia gas.

In the above method of manufacturing the driving substrate, the dielectric gas is a mixed gas containing nitrogen gas, water vapor and a silicon compound.

In the above method of manufacturing the driving substrate, the film thickness control model includes a relation between a temperature and a film thickness growth rate, and the depositing the first dielectric layer and the second dielectric layer on the surface of the first metal layer includes:

depositing the first dielectric layer and the second dielectric layer on the surface of the first metal layer simultaneously;

setting the first dielectric layer and the second dielectric layer to have a same third growth time, and obtaining a first growth rate value of the first dielectric layer and a second growth rate value of the second dielectric layer based on the third growth time, the first thickness value and the second thickness value; and determining, based on the first growth rate value and the second growth rate value, a first growth temperature of the first dielectric layer and a second growth temperature of the second dielectric layer by using the relation between the temperature and the film thickness growth rate, so that the first dielectric layer grows to have a thickness reaching the first thickness value, and the second dielectric layer grows to have a thickness reaching the second thickness value.

In the above method of manufacturing the driving substrate, the first growth temperature ranges from 500° C. to 600° C., and the second growth temperature ranges from 700° C. to 750° C.

In the above method of manufacturing the driving substrate, the first growth temperature is 545° C. and the second growth temperature is 720° C.

The above method of manufacturing the driving substrate further includes cleaning the surface of the first metal layer before depositing the first dielectric layer and the second dielectric layer.

The above method of manufacturing the driving substrate further includes:

patterning the first dielectric layer and the second dielectric layer; and forming a second metal layer on surfaces of the first dielectric layer and the second dielectric layer.

In the above method of manufacturing the driving substrate, the first dielectric layer and the second dielectric layer are made of silicon oxide or silicon nitride.

In the above method of manufacturing the driving substrate, the first thickness value ranges from 50 nm to 130 nm, and the second thickness value ranges from 140 nm to 200 nm.

According to another aspect of the present disclosure, a driving substrate is provided, including:

a specially-shaped display driving area provided with a first signal line;

a first storage capacitor disposed in the specially-shaped display driving area, the first storage capacitor including a first dielectric layer;

a normal display driving area provided with a second signal line; and a second storage capacitor disposed in the normal display driving area, the second storage capacitor including a second dielectric layer, the first dielectric layer and the second dielectric layer being formed on a same plane.

The first dielectric layer has a first thickness value, and the first thickness value is based on a difference between a capacitive load of the first signal line of the specially-shaped display driving area and a capacitive load of a second signal line of the normal display driving area, the second dielectric layer has a second thickness value, and the first thickness value is less than the second thickness value.

In an embodiment, the first thickness value ranges from 50 nm to 130 nm and the second thickness value ranges from 140 nm to 200 nm.

In an embodiment, the first dielectric layer and the second dielectric layer are formed on a first metal layer, and a second metal layer is formed on surfaces of the first dielectric layer and the second dielectric layer.

In an embodiment, the second metal layer is made of molybdenum, titanium, or a molybdenum-titanium alloy.

In an embodiment, the second metal layer is formed by physical deposition.

In an embodiment, the first dielectric layer and the second dielectric layer are made of silicon oxide or silicon nitride.

The present disclosure also provides a display apparatus, including a display screen including the above driving substrate.

According to methods of manufacturing driving substrates provided in the present disclosure, a process parameter can be changed by using a film thickness control model, to flexibly control the thickness of the first dielectric layer and the thickness of the second dielectric layer. By making the thickness of the first dielectric layer less than the thickness of the second dielectric layer, the capacitive load of the first storage capacitor can be increased, thereby increasing the capacitive load of the first signal line. By increasing the capacitive load of the first signal line, the capacitive load of the first signal line and the capacitive load of the second signal line can tend to be the same. Therefore, the display brightness of the specially-shaped display area and the display brightness of the normal display area can tend to be the same.

DETAILED DESCRIPTION OF THE INVENTION

Figure 1:
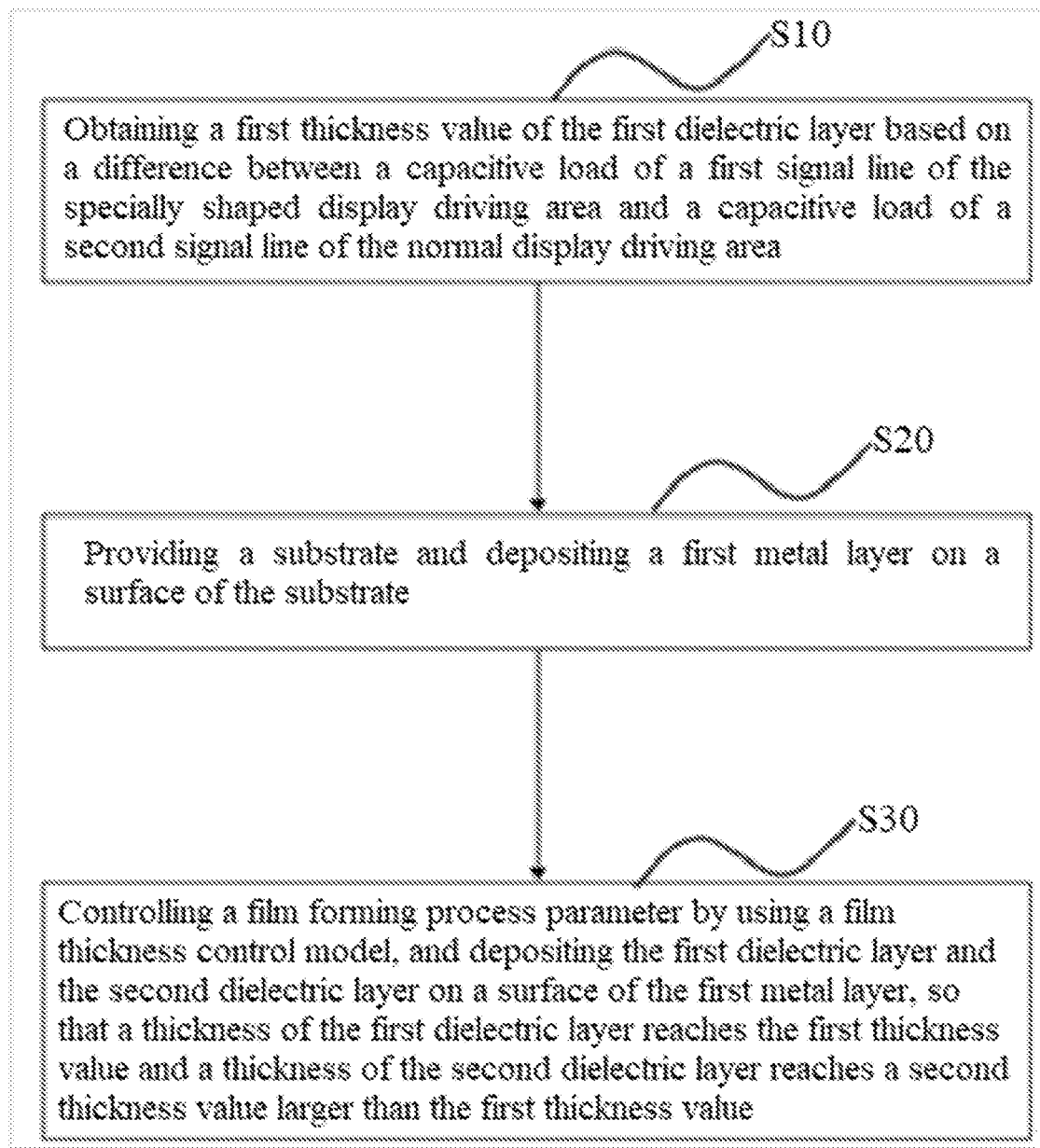
FIG. 1 is a flow diagram illustrating a method of manufacturing a driving substrate according to an embodiment of the present disclosure.

In the manufacturing process of bezel-less screen, a specially-shaped display area is generally formed on the screen by a special design, such as slotting. The number of pixels at the slotted area is less than the number of pixels in a normal display area. Therefore, a load of a pixel driving signal in the specially-shaped display area is greatly different from a load of a pixel driving signal in the normal display area, thereby causing a difference in a RC delay of a driving signal such as a pixel scanning signal, and causing a difference in brightness of the specially-shaped display area and the normal display area, which affects normal use.

In order to facilitate understanding the exemplary embodiments of the present disclosure, exemplary embodiments of the present disclosure will be described in more details hereinafter with reference to the accompanying drawings. Exemplary embodiments of the present disclosure are shown in the drawings. However, the present disclosure can be implemented in many different forms, and is not limited to the embodiments described herein. Rather, these embodiments are presented solely for the purpose of providing thorough and comprehensive understanding of the exemplary embodiments of the present disclosure.

Figure 2:
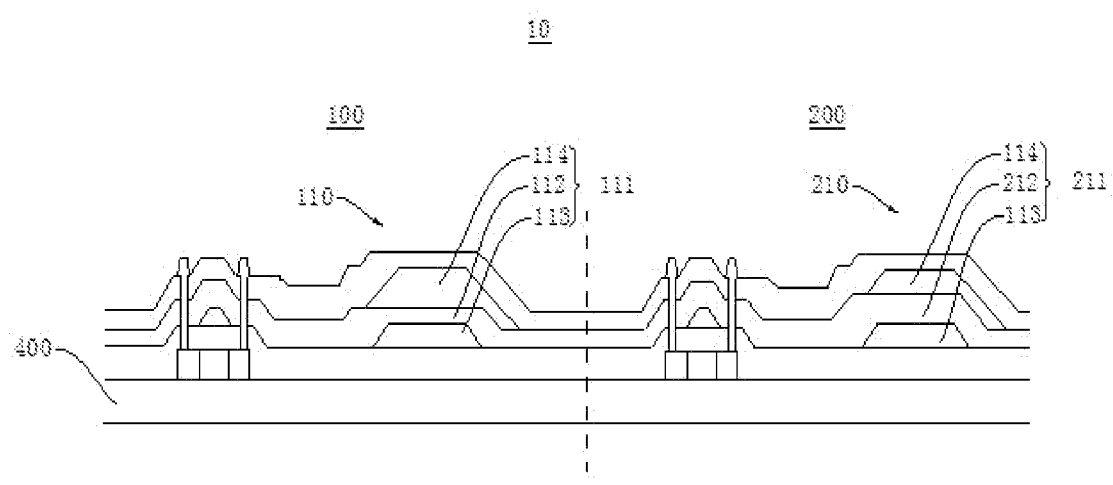
FIG. 2 is a cross-sectional view of a driving substrate according to an embodiment of the present disclosure.

Referring to FIG. 1 and FIG. 2, an embodiment of the present disclosure provides a method of manufacturing a driving substrate. The driving substrate 10 includes a substrate 400, and a specially-shaped display driving area 100 and a normal display driving area 200 disposed on a surface of the substrate 400 and adjacent to each other. The specially-shaped display driving area 100 includes a plurality of first driving circuit units 110 spaced apart from each other. The first driving circuit unit 110 includes a first storage capacitor 111. The first storage capacitor 111 includes a first dielectric layer 112. The normal display driving area 200 includes a plurality of second circuit driving units 210 spaced apart from each other. The second circuit driving unit 210 includes a second storage capacitor 211. The second storage capacitor 211 includes a second dielectric layer 212. The first dielectric layer 112 and the second dielectric layer 212 are formed on a same plane.

In the specially-shaped display driving area 100, a plurality of first signal lines (not shown) may be provided. Each of the first signal lines may be electrically connected to the plurality of first driving circuit units 110. In the normal display driving area 200, a plurality of second signal lines (not shown) may be provided. Each of the second signal lines may be connected to the plurality of second circuit driving units 210. The shape of the normal display driving area 200 is regular, and the specially-shaped display driving area 100 has a structure such as a slot, so the number of the first driving circuit units 110 connected to each of the first signal lines may be less than the number of the second circuit driving units 210 connected to each of the second signal lines, and the capacitive load of each of the first signal lines may be not equal to the capacitive load of each of the second signal lines. As the first signal lines are used to drive pixels of the specially-shaped display area of the display to display, while the second signal lines are used to drive pixels of the normal display area of the display to display, the display brightness of the specially-shaped display area is different from the display brightness of the normal display area.

The method of manufacturing the driving substrate 10 includes:

S10, obtaining a first thickness value of the first dielectric layer 112 based on a difference between a capacitive load of the first signal line of the specially-shaped display driving area 100 and a capacitive load of the second signal line of the normal display driving area 200;

S20, providing a substrate 400, and depositing a first metal layer 113 on a surface of the substrate 400; and S30, controlling a film forming process parameter by using a film thickness control model, and depositing the first dielectric layer 112 and the second dielectric layer 212 on a surface of the first metal layer 113, so that a thickness of the first dielectric layer 112 reaches the first thickness value and a thickness of the second dielectric layer 212 reaches a second thickness value larger than the first thickness value.

At the step S10, the capacitive load of the first signal line may be the sum of capacitive loads of all the first storage capacitors 111 in all the first driving circuit units 110 connected to the first signal line. The capacitive load of the second signal line may be the sum of capacitive loads of all of the second storage capacitors 211 in the second circuit driving unit 210. The capacitive load of the first signal line can be increased by increasing the capacitive load of each of the first storage capacitors 111. A compensation capacitance value that is required to be added to each of the first driving circuit units 110 may be calculated based on the capacitive load of the first signal line and the capacitive load of the second signal line.

A formula for calculating the capacitance is $C=\varepsilon S/4\pi kd$, where $\varepsilon$ is a constant, S is an effective overlap area of a pair of capacitor plates, d is a distance between the capacitor plates, and k is an electrostatic force constant. It can be seen that by reducing the thickness of the first dielectric layer 112 of the first storage capacitor 111, the capacitive load of the first storage capacitor 111 can be increased. Based on the compensation capacitance value, the first thickness value can be obtained by the formula for calculating the capacitance.

At the step S20, the first metal layer 113 may be a transparent metal oxide semiconductor material. The transparent metal oxide semiconductor material may be indium gallium zinc oxide or the like. After the first metal layer 113 is patterned with a photolithography process, capacitor electrodes of the first storage capacitor 111 and the second storage capacitor 211 may be obtained.

At the step S30, the film thickness control model may include a model of a relation between a dielectric gas flow rate and a film thickness growth rate, a model of a relation between a temperature and the film thickness growth rate, a model of a relation between a pressure and the film thickness growth rate, and the like. The film thickness control model may be obtained based on empirical values or may be obtained by simulation calculation. In an embodiment, the film thickness control model may be applied to a CVD device. The film forming process parameter may include a pressure, a temperature, a dielectric gas flow rate, and the like. By using the film thickness control model, process conditions such as pressure, dielectric gas flow rate, temperature, etc. in the CVD device may be controlled, thereby controlling the thickness of the second dielectric layer 212 to reach the second thickness value. The first thickness value is less than the second thickness value.

In the art, the capacitive load value of the first storage capacitor 111 is generally equal to the capacitive load value of the second storage capacitor 211. That is, the first dielectric layer 112 and the second dielectric layer 212 have a same thickness which may be $H_1$. In an embodiment, the capacitive load value of the first signal line is N, and the number of the first storage capacitors 111 connected to the first signal line is X. The capacitive load value of the second signal line is M, and M is greater than N. The number of the second storage capacitors 211 connected to the second signal line is Y, and Y is greater than X. Therefore, the compensation capacitance value that is required to be added to the first storage capacitor 111 in each of the first driving circuit units 110 is $Q=(M-N)/X$. The thickness d which is required to be reduced from each of the first dielectric layers 112 may be calculated from $Q=\varepsilon S/4\pi kd$. Thus, the required first thickness value may be obtained as $H_2=H_1-d$.

The method of manufacturing the driving substrate 10 provided in the exemplary embodiments of the present disclosure includes: S10, obtaining a first thickness value of the first dielectric layer 112 based on a difference between a capacitive load of the specially-shaped display driving area 100 and a capacitive load of the normal display driving area 200; S20, providing a substrate 400, and depositing a first metal layer 113 on a surface of the substrate 400; S30, controlling a process parameter by using a film thickness control model, depositing the first dielectric layer 112 and the second dielectric layer 212 on the surface of the first metal layer 113, so that the thickness of the first dielectric layer 112 reaches the first thickness value and the thickness of the second dielectric layer 212 reaches the second thickness value. By making the thickness of the first dielectric layer 112 less than the thickness of the second dielectric layer 212, the capacitive load of the first storage capacitor can be increased, thereby increasing the capacitive load of the first signal line, so that the capacitive load of the first signal line and the capacitive load of the second signal line tend to be the same. Thus, the display brightness of the specially-shaped display area and the display brightness of the normal display area tend to be same.

In an embodiment, the film thickness control model includes a model of a relation between a dielectric gas flow rate and a film thickness growth rate. The model of the relation between the dielectric gas flow rate and the film thickness growth rate includes a relation between the dielectric gas flow rate and the film thickness growth rate, and the step S30 includes:

S31, depositing the first dielectric layer 112 and the second dielectric layer 212 on the surface of the first metal layer 113 simultaneously;

S32, directing dielectric gas to pass through the second dielectric layer 212 and the first dielectric layer 112 sequentially, the dielectric gas having a gas flow rate of a first gas flow rate value to pass through the first dielectric layer 112, and a gas flow rate of a second gas flow rate value to pass through the second dielectric layer 212; and S33, obtaining, based on the first thickness value and the first gas flow rate value, a first growth time of the first dielectric layer 112 by using the relation between the dielectric gas flow rate and the film thickness growth rate, so that the first dielectric layer 112 grows to have a thickness reaching the first thickness value, and obtaining, based on the second thickness value and the second gas flow rate value, a second growth time of the second dielectric layer 212 by using the relation between the dielectric gas flow rate and the film thickness growth rate, so that the second dielectric layer 212 grows to have a thickness reaching the second thickness value.

At the step S31, the first dielectric layer 112 and the second dielectric layer 212 may be deposited on the surface of the first metal layer 113 simultaneously through a chemical vapor deposition method in an embodiment. That is, the first dielectric layer 112 and the second dielectric layer 212 may be formed in a same process.

Figure 3:
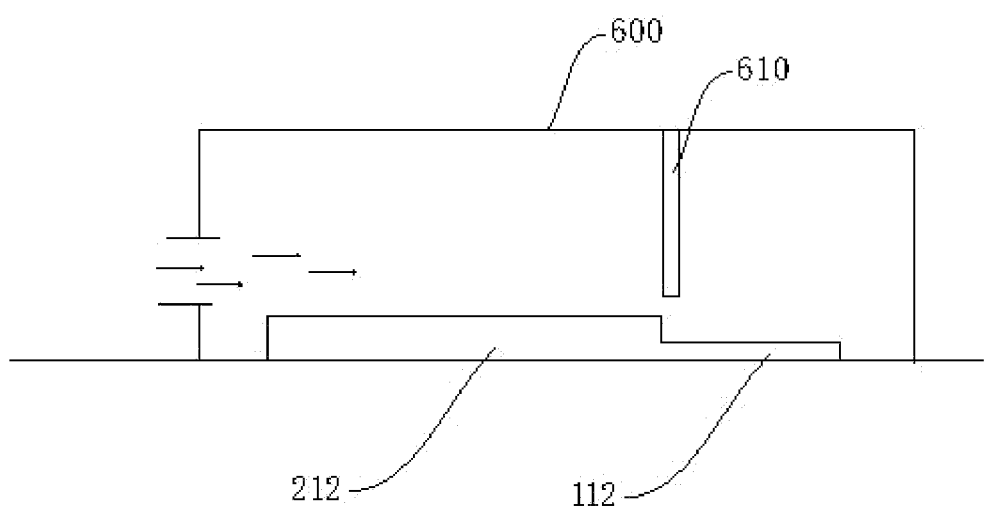
FIG. 3 is a schematic diagram of a reaction chamber according to an embodiment of the present disclosure.

At the step S32, the first metal layer 113 may be disposed at a horizontal plane in an embodiment. As shown in FIG. 3, the dielectric gas flow rate is controlled as a single process variable, and temperature, pressure and other process conditions in the reaction chamber 600 are uniform. The dielectric gas is directed to pass through a deposition position of the second dielectric layer 212 and a deposition position of the first dielectric layer 112 sequentially. The deposition speed at the deposition position of the second dielectric layer 212 is greater than the deposition speed at the deposition position of the first dielectric layer 112 due to gravity and airflow diffusion. Therefore, the film thickness growth rate of the second dielectric layer 212 is greater than the film thickness growth rate of the first dielectric layer 112. The model of the relation between the dielectric gas flow rate and the film thickness growth rate reflects the correspondence between the dielectric gas flow rate and the film thickness growth rate.

In an embodiment, the volume of the reaction chamber 600 may be 25 L. The dielectric gas may be trimethylsilylamine gas and ammonia gas, and the flow ratio of the trimethylsilylamine gas to the ammonia gas may be 5:1. The mixed gas of the trimethylsilylamine gas and the ammonia gas may be introduced into the reaction chamber 600 at a rate of 0.2 L/min. As measured by a flow meter, the mixed gas has a second gas flow rate of 0.15 L/min at the deposition position of the second dielectric layer 212, and a first gas flow rate of 0.8 L/min at the deposition position of the first dielectric layer 112.

At the step S33, by using the second gas flow rate value of 0.15 L/min and the first gas flow rate value of 0.8 L/min, a film thickness growth rate of the second dielectric layer 212 may be obtained as 0.5 nm/s, and a film thickness growth rate of the first dielectric layer 112 may be obtained as 0.3 nm/s in an embodiment, based on the relation between the dielectric gas flow rate and the film thickness growth rate. In an embodiment, the second thickness value is 110 nm and the first thickness value is 60 nm. The first growth time may be obtained as 200s based on the film thickness growth rate of 0.3 nm/s of the first dielectric layer 112 and the first thickness value of 60 nm. The second growth time of 220s may be obtained, based on the second thickness value of 110 nm and the film thickness growth rate of 0.5 nm/s of the second dielectric layer 212. It can be understood that the relation between the dielectric gas flow rate and the film thickness growth rate can be obtained experimentally. That is, data of a plurality of dielectric gas flow rates and a plurality of film thickness growth rates mapping one to one with the plurality of dielectric gas flow rates can be obtained first, and then the data can be nonlinearly fitted to obtain the relation between the dielectric gas flow rate and the film thickness growth rate.

In the embodiment described above, the growth time of the first dielectric layer 112 may be set as 200s and the growth time of the second dielectric layer 212 may be set as 220s by controlling process parameters such as the flow direction of the dielectric gas.

Referring to FIG. 3, in an embodiment, the second growth time is greater than the first growth time. When the first growth time is reached, a barrier 610 is disposed between the first dielectric layer 112 and the second dielectric layer 212 to prevent the first dielectric layer 112 from growing. The above embodiment shows that, since the dielectric gas passes through the deposition position of the second dielectric layer 212 and the deposition position of the first dielectric layer 112 sequentially, and the second growth time is greater than the first growth time, the thickness of the first dielectric layer 112 first reaches the first thickness value. After the thickness of the first dielectric layer 112 reaches the first thickness value, a barrier 610 is disposed between the first dielectric layer 112 and the second dielectric layer 212, so that the dielectric gas can no longer reach the first dielectric layer 112. The first dielectric layer 112 cannot continue to grow, while the second dielectric layer 212 can continue to grow. Thus, the thickness of the second dielectric layer 212 may be greater than the thickness of the first dielectric layer 112. Thereby, the capacitive load of the first signal line can be increased such that the capacitive load of the first signal line and the capacitive load of the second signal line tend to be the same. It can be understood that the barrier 610 can be disposed in the middle of reaction chamber 600. The action of the barrier 610 can be controlled automatically. It is only necessary to provide the relevant barrier 610 in the reaction chamber 600 provided, and the first dielectric layer 112 and the second dielectric layer 212 having different thicknesses can simultaneously grow in one process by using the method of growing the material in the above embodiment, which has the advantages of convenience, efficiency, and cost-saving.

In an embodiment, the dielectric gas comprises trimethylsilylamine gas and ammonia gas. The dielectric gas may also be a mixed gas containing nitrogen gas, water vapor and a silicon compound.

In an embodiment, the film thickness control model includes a model of a relation between the temperature and film thickness growth rate including a relation between the temperature and film thickness growth rate relation. Based on this film thickness control model, the above step S30 includes:

S310, depositing the first dielectric layer 112 and the second dielectric layer 212 on the surface of the first metal layer 113 simultaneously;

S320, setting the first dielectric layer 112 and the second dielectric layer 212 to have a same third growth time, and obtaining a first growth rate value of the first dielectric layer 112 and a second growth rate value of the second dielectric layer 212 based on the third growth time, the first thickness value and the second thickness value; and S330, determining, based on the first growth rate value and the second growth rate value, a first growth temperature of the first dielectric layer 112 and a second growth temperature of the second dielectric layer 212 by using the relation between the temperature and the film thickness growth rate, so that the first dielectric layer 112 grows to have a thickness reaching the first thickness value, and the second dielectric layer 212 grows to have a thickness reaching the second thickness value.

At the step S320, the third growth time may be 250 s, the first thickness value may be 80 nm, and the second thickness value may be 110 nm. Thus the first growth rate value may be 0.32 nm/s and the second growth rate value may be 0.44 nm/s.

At the step S330, the corresponding relation between the growth rate value and the temperature value is included in the model of the relation between the temperature and the film thickness growth rate on the premise that the temperature is a single variable. It can be understood that the relation between the temperature and the film thickness growth rate can be obtained experimentally. That is, data of a plurality of temperature values and a plurality of growth rate values mapping one to one with the plurality of temperature values can be obtained first, and then the data can be nonlinearly fitted to obtain the relation between the temperature and the film thickness growth rate. In an embodiment, it may be determined that the first growth rate value of 0.32 nm/s is mapped to the temperature of 545° C., and the second growth rate value of 0.44 nm/s is mapped to the temperature of 720° C. In an embodiment, heating furnaces may be disposed under the first dielectric layer 112 and the second dielectric layer 212, respectively, and the growth temperatures of the first dielectric layer 112 and the second dielectric layer 212 may be controlled by setting the temperature of heating furnaces.

In an embodiment, the first growth temperature ranges from 500° C. to 600° C. and the second growth temperature ranges from 700° C. to 750° C. When the first growth temperature ranges from 500° C. to 600° C. and the second growth temperature ranges from 700° C. to 750° C., the first dielectric layer 112 and the second dielectric layer 212 grow to have an uniform thickness, and the difference between the thickness of the first dielectric layer 112 and the thickness of the second dielectric layer 212 does not exceed 0.1 nm. Preferably, the first growth temperature is 545° C. The second growth temperature is 720° C. Under the temperature condition described above, the first dielectric layer 112 and the second dielectric layer 212 have thicknesses with the best controlled effect, and the highest levelness.

In an embodiment, before the step 30, the surface of the first metal layer 113 may be cleaned. In an embodiment, the material to be cleaned may be mainly photoresist left on the surface of the first metal layer 113 during the formation of the first metal layer 113.

In an embodiment, after the step S30, the method further includes:

S41, patterning the first dielectric layer 112 and the second dielectric layer 212; and S42, forming a second metal layer 114 on the surfaces of the first dielectric layer 112 and the second dielectric layer 212.

In an embodiment, the first dielectric layer 112 and the second dielectric layer 212 may be patterned by photolithography.

In an embodiment, the second metal layer 114 may be made of molybdenum, titanium, or a molybdenum-titanium alloy or the like, and may be formed by physical deposition.

In an embodiment, the first dielectric layer 112 and the second dielectric layer 212 are made of silicon oxide or silicon nitride, which has a good insulating property and a relatively high dielectric constant.

In an embodiment, the first thickness value ranges from 50 nm to 130 nm and the second thickness value ranges from 140 nm to 200 nm. In general, when the first thickness value ranges from 50 nm to 130 nm and the second thickness value ranges from 140 nm to 200 nm, the capacitive load of all of the first storage capacitors 111 of the specially-shaped display driving area 100 of the driving substrate 10 and the capacitive load of all of the second storage capacitors 211 of the normal display driving area 200 of the driving substrate 10 tend to be the same. Within this range, the first thickness value and the second thickness value may be calculated according to the specific routing of the circuit and the shape and size of the slot on the driving substrate 10.

Technical features of the above embodiments may be combined arbitrarily. For brief description, not all possible combinations of the technical features in the above embodiments are described. However, as long as the combinations of the technical features are not contradicted, the combinations should be considered as belonging to the scope of this disclosure.

The above embodiments are merely illustrative of several implementations of the present disclosure, and their description is detailed and specific, but cannot therefore be understood as a limitation to the scope of the present disclosure. It should be noted that a person of ordinary skill in the art may make some variations and modifications without departing from the concept of the present disclosure, and the variations and modifications belong to the protection scope of the present disclosure. Therefore, the protection scope of the present disclosure should be subject to the appended claims.

The invention claimed is:

1. A method of manufacturing a driving substrate including a first storage capacitor and a second storage capacitor, the first storage capacitor being disposed in a specially-shaped display driving area and including a first dielectric layer, the second storage capacitor being disposed in a normal display driving area and including a second dielectric layer, the first dielectric layer and the second dielectric layer being formed on a same plane, the method comprising:

obtaining a first thickness value of the first dielectric layer based on a difference between a capacitive load of a first signal line of the specially-shaped display driving area and a capacitive load of a second signal line of the normal display driving area;

providing a substrate and depositing a first metal layer on a surface of the substrate; and controlling a film forming process parameter by using a film thickness control model, and depositing the first dielectric layer and the second dielectric layer on a surface of the first metal layer, so that a thickness of the first dielectric layer reaches the first thickness value and a thickness of the second dielectric layer reaches a second thickness value larger than the first thickness value.

2. The method of claim 1, wherein the film thickness control model comprises a ratio between a dielectric gas flow rate and a film thickness growth rate, and the depositing the first dielectric layer and the second dielectric layer on the surface of the first metal layer surface comprises:

depositing the first dielectric layer and the second dielectric layer on the surface of the first metal layer simultaneously;

directing dielectric gas to pass through a deposition position of the second dielectric layer and a deposition position of the first dielectric layer sequentially, wherein the dielectric gas passes at a gas flow rate of a first gas flow rate value to pass through the deposition position of the first dielectric layer, and the dielectric gas passes at a gas flow rate of a second gas flow rate value to pass through the deposition position of the second dielectric layer;

obtaining, based on the first thickness value and the first gas flow rate value, a first growth time of the first dielectric layer by using the relation between the dielectric gas flow rate and the film thickness growth rate, so that the first dielectric layer grows to have a thickness reaching the first thickness value; and obtaining, based on the second thickness value and the second gas flow rate value, a second growth time of the second dielectric layer, by using the relation between the dielectric gas flow rate and the film thickness growth rate, so that the second dielectric layer grows to have a thickness reaching the second thickness value.

3. The method of claim 2, wherein the second growth time is greater than the first growth time, and when the first growth time is reached, a barrier is disposed between the first dielectric layer and the second dielectric layers to prevent the first dielectric layer from growing.

4. The method of claim 2, wherein the dielectric gas comprises trimethylsilylamine gas and ammonia gas.

5. The method of claim 2, wherein the dielectric gas is a mixed gas containing nitrogen gas, water vapor and a silicon compound.

6. The method of claim 1, wherein the film thickness control model comprises a relation between a temperature and a film thickness growth rate, and the depositing the first dielectric layer and the second dielectric layer on the surface of the first metal layer comprises:

depositing the first dielectric layer and the second dielectric layer on the surface of the first metal layer simultaneously;

setting the first dielectric layer and the second dielectric layer to have a same third growth time, and obtaining a first growth rate value of the first dielectric layer and a second growth rate value of the second dielectric layer based on the third growth time, the first thickness value and the second thickness value; and determining, based on the first growth rate value and the second growth rate value, a first growth temperature of the first dielectric layer and a second growth temperature of the second dielectric layer by using the relation between the temperature and the film thickness growth rate, so that the first dielectric layer grows to have a thickness reaching the first thickness value, and the second dielectric layer grows to have a thickness reaching the second thickness value.

7. The method of claim 6, wherein the first growth temperature ranges from 500° C. to 600° C. and the second growth temperature ranges from 700° C. to 750° C.

8. The method of claim 6, wherein the first growth temperature is 545° C. and the second growth temperature is 720° C.

9. The method of claim 1, further comprising: cleaning the surface of the first metal layer before depositing the first dielectric layer and the second dielectric layer.

10. The method of claim 1, further comprising:
patterning the first dielectric layer and the second dielectric layer; and
forming a second metal layer on surfaces of the first dielectric layer and the second dielectric layer.

11. The method of claim 1, wherein the first dielectric layer and the second dielectric layer are made of silicon oxide or silicon nitride.

12. The method of claim 1, wherein the first thickness value ranges from 50 nm to 130 nm, and the second thickness value ranges from 140 nm to 200 nm.

13. A driving substrate, comprising:
a specially-shaped display driving area provided with a first signal line;
a first storage capacitor disposed in the specially-shaped display driving area, the first storage capacitor comprising a first dielectric layer;
a normal display driving area provided with a second signal line; and
a second storage capacitor disposed in the normal display driving area, the second storage capacitor comprising a second dielectric layer, the first dielectric layer and the second dielectric layer being formed on a same plane;
wherein the first dielectric layer has a first thickness value, and the first thickness value is based on a difference between a capacitive load of the first signal line of the specially-shaped display driving area and a capacitive load of a second signal line of the normal display driving area, the second dielectric layer has a second thickness value, and the first thickness value is less than the second thickness value.

14. The driving substrate of claim 13, wherein the first thickness value ranges from 50 nm to 130 nm, and the second thickness value ranges from 140 nm to 200 nm.

15. The driving substrate of claim 13, wherein the first dielectric layer and the second dielectric layer are formed on a first metal layer, and a second metal layer is formed on surfaces of the first dielectric layer and the second dielectric layer.

16. The driving substrate of claim 15, wherein the second metal layer comprises of molybdenum, titanium, or a molybdenum-titanium alloy.

17. The driving substrate of claim 15, wherein the second metal layer is formed by physical deposition.

18. The driving substrate of claim 13, wherein the first dielectric layer and the second dielectric layer comprise silicon oxide or silicon nitride.

19. A display apparatus, comprising a display screen comprising the driving substrate of claim 11.

* * * * *